United States Patent
Avron et al.

(10) Patent No.: US 11,996,859 B1
(45) Date of Patent: May 28, 2024

(54) CORRECTING MEMORY DATA USING AN ERROR CODE AND A MEMORY TEST RESULT

(71) Applicant: Amazon Technologies, Inc., Seattle, WA (US)

(72) Inventors: Itai Avron, Petach Tikva (IL); Erez Sabbag, Koranit (IL)

(73) Assignee: Amazon Technologies, Inc., Seattle, WA (US)

(*) Notice: Subject to any disclaimer, the term of this patent is extended or adjusted under 35 U.S.C. 154(b) by 0 days.

(21) Appl. No.: 17/119,572

(22) Filed: Dec. 11, 2020

(51) Int. Cl.
| | |
|---|---|
| H03M 13/11 | (2006.01) |
| G11C 29/36 | (2006.01) |
| G11C 29/42 | (2006.01) |
| H03M 13/15 | (2006.01) |
| G06F 11/10 | (2006.01) |
| G11C 13/00 | (2006.01) |
| G11C 29/02 | (2006.01) |
| G11C 29/44 | (2006.01) |
| G11C 29/52 | (2006.01) |

(52) U.S. Cl.
CPC ......... H03M 13/1105 (2013.01); G11C 29/36 (2013.01); G11C 29/42 (2013.01); H03M 13/1515 (2013.01); H03M 13/152 (2013.01); G06F 11/1048 (2013.01); G11C 2013/0057 (2013.01); G11C 29/024 (2013.01); G11C 2029/3602 (2013.01); G11C 29/44 (2013.01); G11C 29/52 (2013.01)

(58) Field of Classification Search
CPC ......... H03M 13/1105; H03M 13/1515; H03M 13/152; G11C 29/36; G11C 29/42; G11C 2029/3602; G11C 29/44; G11C 29/52; G11C 29/024; G11C 2013/0057; G06F 11/1048

See application file for complete search history.

(56) References Cited

U.S. PATENT DOCUMENTS

| | | | | |
|---|---|---|---|---|
| 5,754,753 | A * | 5/1998 | Smelser | G06F 11/1012 714/763 |
| 7,506,226 | B2 * | 3/2009 | Gajapathy | G06F 11/1044 714/719 |
| 9,983,972 | B2 * | 5/2018 | Bandyopadhyay | G06F 11/167 |
| 2005/0229076 | A1* | 10/2005 | Riho | G06F 11/1076 714/E11.042 |
| 2016/0034353 | A1* | 2/2016 | Tuers | H03M 13/152 714/764 |
| 2021/0311821 | A1* | 10/2021 | Ryu | G06F 11/1016 |

* cited by examiner

*Primary Examiner* — April Y Blair
*Assistant Examiner* — Sazzad Hossain
(74) *Attorney, Agent, or Firm* — Klarquist Sparkman, LLP

(57) ABSTRACT

A decoder is disclosed with error correction for memory data. The decoder's error correction is extended to additional faulty bits by integrating a memory test into the error correction to identify faulty bits in the memory data. A method for correction can include writing a known pattern to the failing address (and possibly to neighboring addresses), reading the known pattern back and comparing the read data to the written pattern to identify the failing bits. The failing bits are then used together with the error correction data to correct memory data having multiple incorrect bits or to alert other components about the failing bit locations.

17 Claims, 7 Drawing Sheets

US 11,996,859 B1

CORRECTING MEMORY DATA USING AN ERROR CODE AND A MEMORY TEST RESULT

BACKGROUND

Dynamic random-access memory (DRAM) is popular due to its performance and density. However, to reduce a size of the memory, control of the memory has been offloaded to circuits known as memory controllers. These controller circuits can be located in different places, such as integrated into a processor or a stand-alone Application Specific Integrated Circuit (ASIC) positioned between the processor and the memory.

For accessing memories, such as DRAM, error correction codes (ECCs) can be used to protect against errors and data corruption. To read the data, the ECC decode occurs, together with a potential correction of the data due to an ECC error. However, not all errors are correctable, particularly if too many bits of the data have errors.

DETAILED DESCRIPTION

A memory controller channel is built by aggregating several DRAM devices (dies) up to a required bus width (e.g., 64 bit). These memory devices can be of varying widths (e.g., x4, x8, x16, etc.). In addition, ECC devices are added to the DRAM devices to allow for error correction. A particular fault of interest is when a device returns a large number of data bits that are erroneous. This may occur due to different issues, such as a bad column/row decoder, an entire device failure, a bank failure, etc. Current industry DRAM devices provide sufficient ECC bits to correct a x4 device failure. However, using ECC correction of x8 devices is not currently supported. A decoder is disclosed with error correction for memory data that extends beyond a x4 device failure or a failing die. The decoder's error correction is extended to additional faulty bits by integrating a memory test into the error correction to identify faulty bits in the memory data. A method for correction can include writing a known pattern to the failing address (and possibly to neighboring addresses), reading the known pattern back and comparing the read data to the written pattern to identify the failing bits. The failing bits are then used together with the error correction data to correct memory data having multiple incorrect bits or to alert other components about the failing bit locations.

In one example, ECC correction can be extended to a x8 error by performing the following: 1) saving the failing memory word in a buffer; 2) writing a known pattern to the failing address (and possibly to neighboring addresses); 3) reading data again at the failing address, and comparing the data to the written pattern to identify the failing bits; 4) iterating over steps (2) and (3) with different patterns to increase confidence over which device is failing; 5) if all of the errors are from a same device (i.e., die), marking the device as an erased device; 6) re-running the original failing data from the saved buffer into a decoder with erasure enabled by using the ECC bits and the results of the memory test; 7) maintaining the same erasure configuration for future data, or returning to the original configuration.

Figure 1:
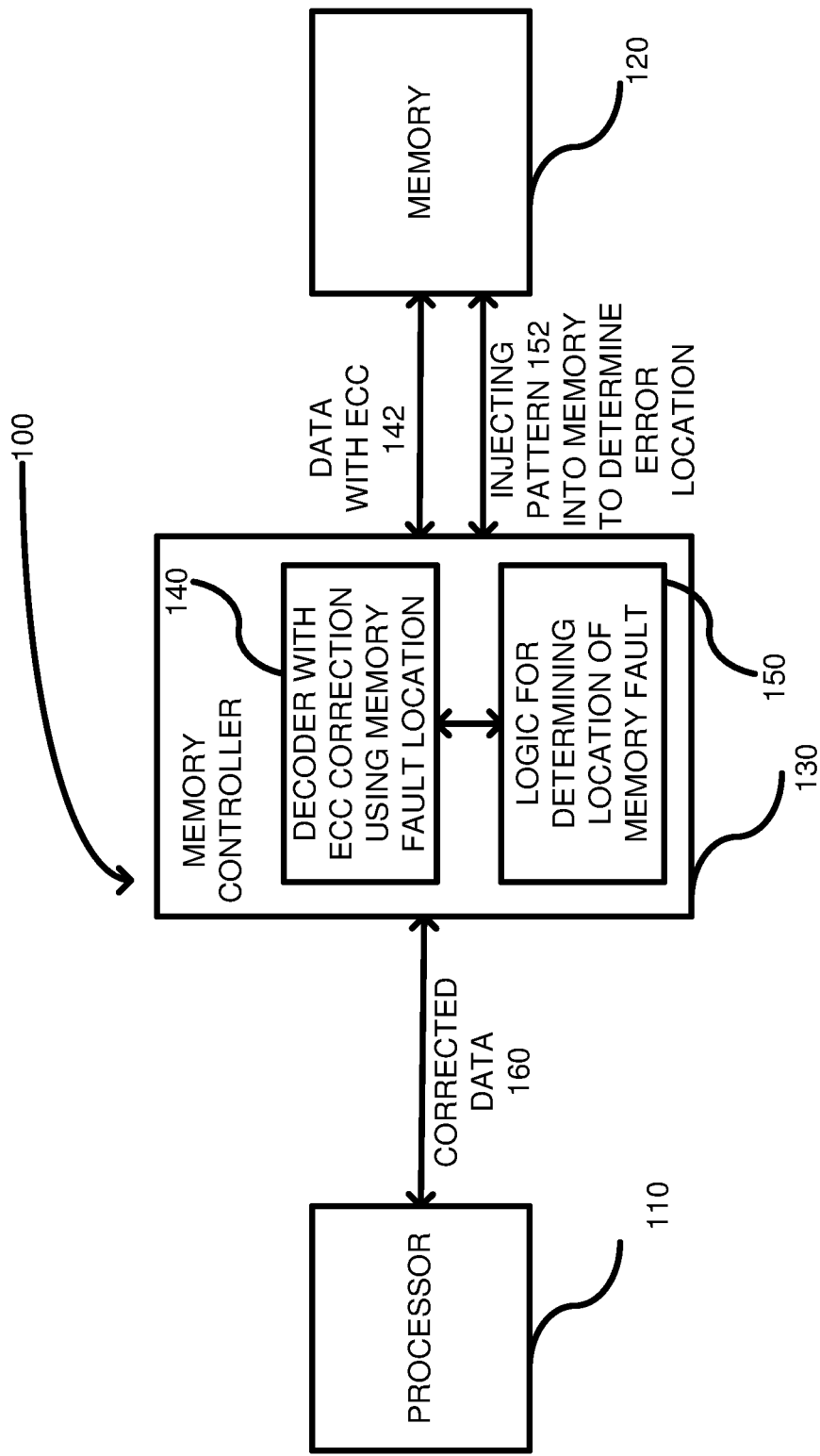
FIG. 1 is a system diagram according to one embodiment wherein a memory test is integrated into ECC correction to allow correction of data having multiple defective bits.

FIG. 1 is an embodiment of a system 100 including a processor 110, a memory 120, and a memory controller 130 positioned between the processor 110 and the memory 120. The memory 120 can be any of a variety of memories that store data including EEPROM, flash memory, DRAM, SDRAM, etc. The processor can be a general-purpose central processing unit (CPU), a processor in an application-specific integrated circuit (ASIC) or any other type of processor or controller. The memory controller 130 can be a stand-alone integrated circuit (IC) or integrated into the processor 110. Example memory controllers include a double data rate (DDR) memory controller, a dual-channel memory controller, or a flash memory controller. In any case, the memory controller is a digital circuit that manages the flow of data going to and from the memory 120. The memory controller is sometimes called a memory chip controller (MCC) or a memory controller unit (MCU). In the case of DRAM, the memory controller includes logic to read and write to DRAM and to refresh DRAM. In this embodiment, the memory controller 130 includes a decoder 140 with ECC correction. The decoder 140 can also input data indicating the defective memory area, such as which bits are bad or which die is bad, which is received from logic 150. The logic 150 can include dynamic memory testing for testing the memory 120. In one example, the decoder 140 can set a flag indicating that data 142 has an unrecoverable error. Thus, the decoder cannot correct the error without additional bit information. In some embodiments, the decoder 140 only sets the flag when such a situation occurs. In addition, the decoder 140 can provide the address that is failing to the logic 150. Alternatively, the logic 150 can monitor transactions and know the failing address by monitoring a bus between the memory controller 130 and the memory 120. In response to the flag, the logic 150 can inject any desired pattern 152 (or a particular code) into the failing memory address and read back the injected data to determine which bits or die has the error. Thus, the logic 150 performs a memory test as part of the error correction process including injecting a pattern into the memory. Once it is determined which bits or dies are problematic, this error information can be fed back into the decoder 140 to allow advanced decoding using not only the ECC embedded in the data, but also an identifier of which bits or dies are failing. Using this information, more complex error conditions (such as x8 errors) can be corrected. Although an ECC check is generally described herein, other types of error checking can be used, such as a checksum. A variety of types of ECCs can be used, including Reed-Solomon, Hamming, etc. Thus, the processor 110 can request data at a predetermined address within the memory 120. In response, the memory 120 can deliver memory data 142 associated with the address to the memory controller 130. The memory controller 130 can correct the data, if necessary, and to deliver corrected data 160 to the processor 110. The corrected data is generated by the decoder 140 through additional knowledge of what bits in the data are problematic, which is known as erasure information. The identification of the bit errors is determined by the logic 150 that performs a memory test immediately on the memory address in response to a determination that there is an ECC error that is not correctable. For simplicity, the description herein refers to identifying failing bits, but it should be understood that the error information can be faulty die information, which is groups of bits. Although the test is described as occurring when there is an error, the test can also be triggered as part of a scan process of the memory.

Figure 2:
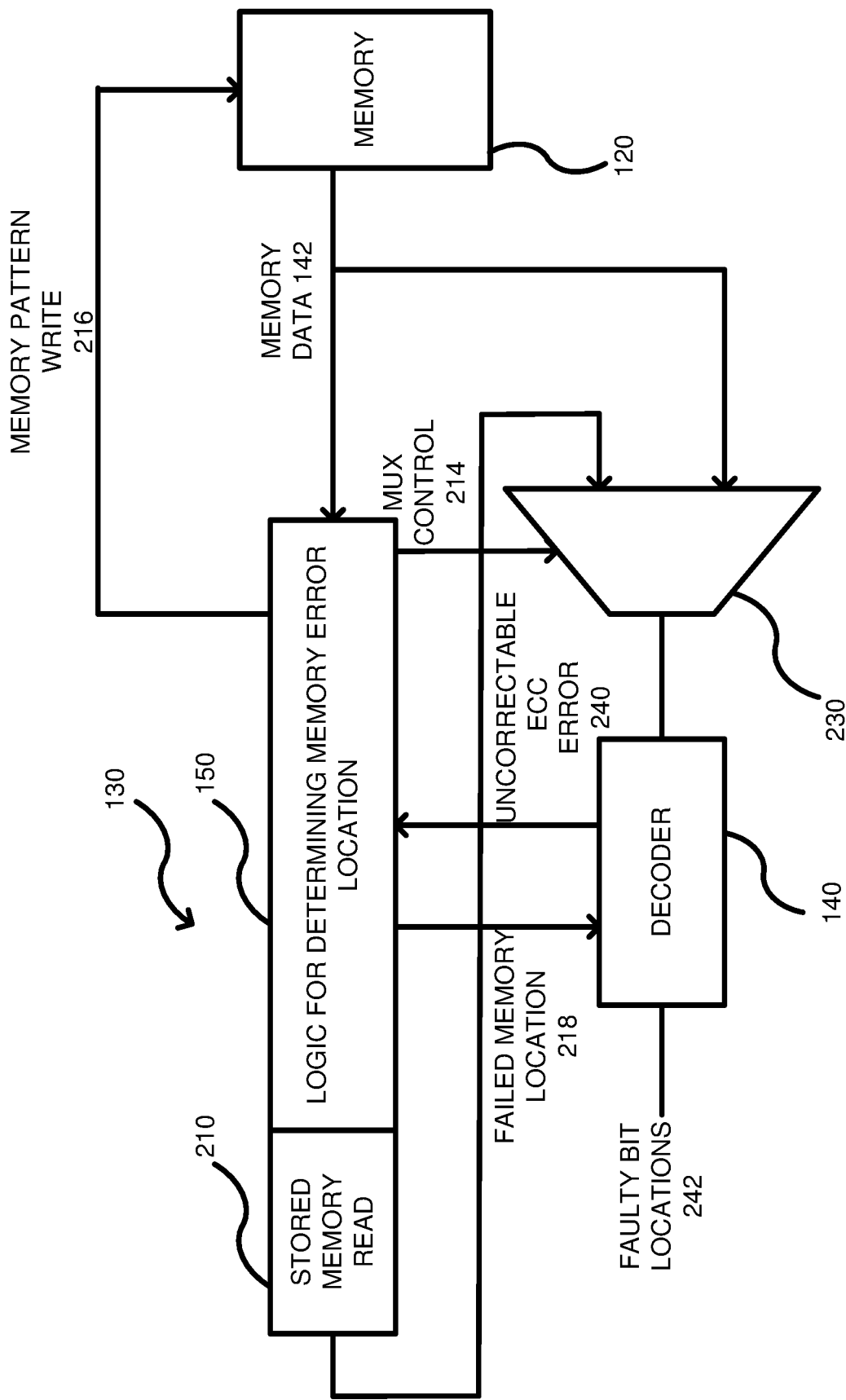
FIG. 2 is a circuit diagram according to another embodiment for correcting an ECC error using an integrated memory test.

FIG. 2 is a circuit diagram according to one embodiment that expands on the details of FIG. 1. The logic 150 (which can be implemented in hardware, software or firmware) includes a memory area 210 that stores the last memory data 142 read from the memory 120. The memory area 210 can include sufficient storage to store a plurality of memory reads that matches a size of a decoder pipeline, discussed below. The logic 150 controls an input (see mux control 214) of a multiplexer 230 that either passes stored memory data from the memory area 210 or memory data 142 from the memory 120. The logic 150 further includes a memory pattern write output 216 for writing any desired data to the memory 120. Finally, the logic 150 also includes an output 218 that identifies which bits are faulty at a particular memory address of interest. The decoder 140 (which can also be implemented in hardware, software or firmware) includes a flag 240 indicating that an uncorrectable ECC error has occurred. Thus, in normal operation, the multiplexer control 214 allows memory data 142 to pass to the decoder 140 and the decoder outputs the data on output 242 including any faulty bit locations. Alternatively, the decoder 140 can perform correction of the data and the output 242 can be the corrected memory data. In some implementations, if the decoder 140 encounters an error, it can perform a read of the memory address again to reduce the probability of bus-related transient errors. If the decoder 140 encounters an error that is not correctable using the ECC correction, then the flag 240 is set. An example of when such an error occurs is when too many bits are faulty. The logic 150 then stores the read memory data at memory location 210 and performs one or more memory tests on the memory 120 at the failing address using the memory pattern write output 216. As explained further below, the memory pattern is written and then read back to determine which bits are faulty. Example memory patterns include all 0's or all 1's to determine any stuck-at faults. Other memory patterns can be used. Additionally, random data without a pattern can be used. The faulty bits location are then supplied on output 218 to the decoder 140 and simultaneously the previous memory data (with ECC) are output from the memory area 210. The mux control 214 is switched to allow the previous memory data from memory area 210 to pass through the multiplexer 230 to the decoder 140. The decoder 140 can then output the faulty bit locations 242. Alternatively, the decoder 140 uses the failed memory locations 218 and the ECC within the memory data to correct the memory data and supply the corrected data 242 on its output.

Figure 3:
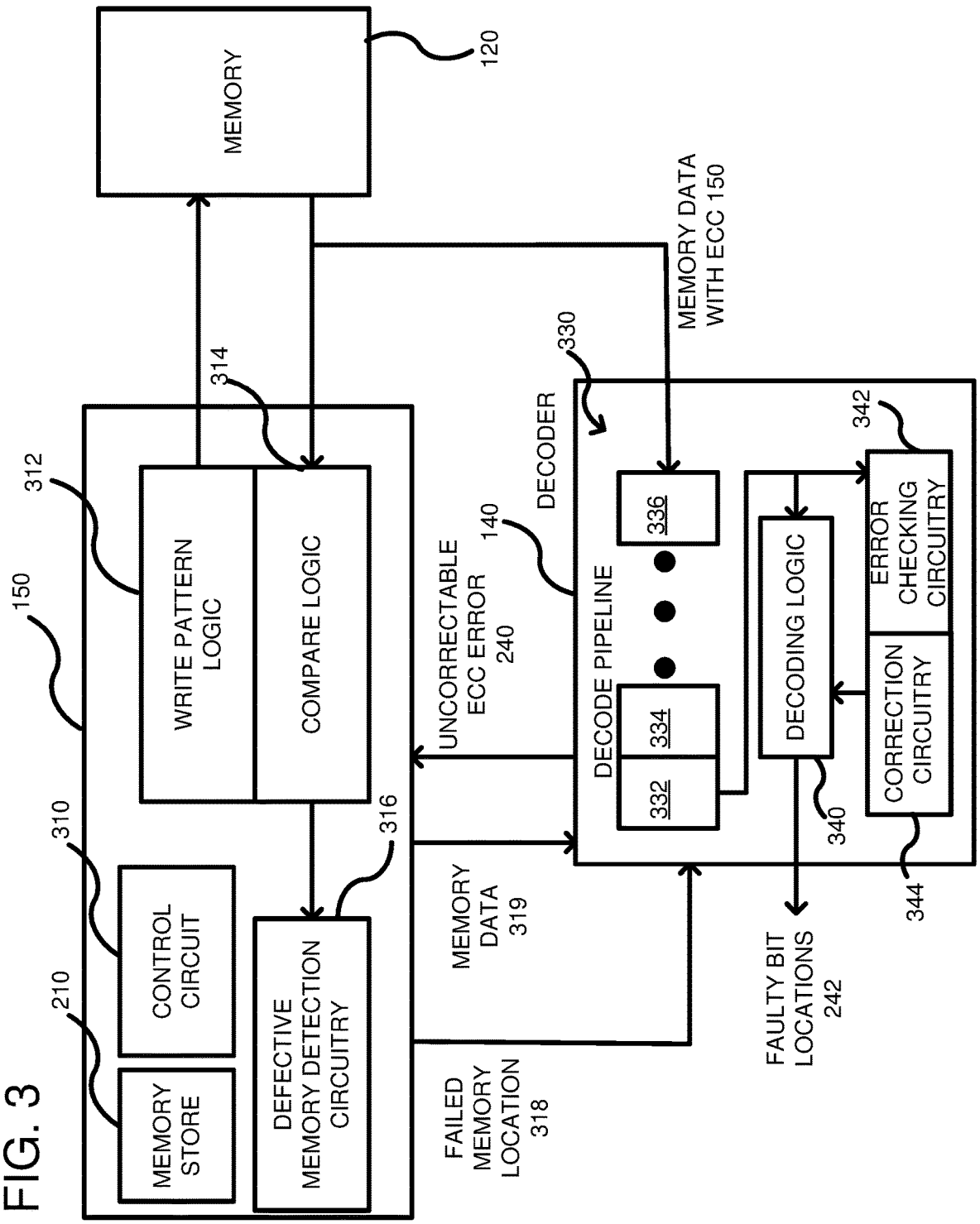
FIG. 3 shows further details of the circuit diagram of FIG. 2.

FIG. 3 shows further details of the logic 150 and the decoder 140. The logic 150 includes the memory store 210, a control circuit 310, write pattern logic 312, compare logic 314, and defective memory detection circuit 316. The outputs of the logic 150 include the failed memory location bits 318 and the memory data 319. In response to the uncorrectable ECC error flag 240, the control circuit 310 initiates a memory test on the address at issue. The address information can be passed from the decoder 140 to the control circuit 310 with the error flag 240, or the control circuit 310 can monitor transactions from the memory 120 and determine the address autonomously. The control circuit 310 initiates the write pattern logic 312 to perform a memory write to the address of the memory 120. After the write is completed, the compare logic 314 performs a read of the same address and compares the data written to the data received on a bit-by-bit basis. The defective memory detection circuit 316 uses the output of the compare logic 314 to determine which memory bits are defective at the address. If desired, numerous writes and reads can occur using different test patterns to the memory address to increase the likelihood of identifying the problem bits. After a desired length of testing is completed, as dictated by the control circuit 310, the defective memory detection circuit 316 releases the failed memory location bits 318 to the decoder 140. The memory data 319 is also transmitted to the decoder 140.

The decoder 140 is shown as including a decode pipeline 330 including sequentially coupled memory buffers 332, 334, and 336 (any number of buffers can be used) to receive multiple reads from the memory 120. The decoder 140 further includes decoding logic 340, error checking circuitry 342 and correction circuitry 344. The error checking circuitry analyzes the ECC in the memory data 150 and determines whether a correction is necessary. The correction circuitry 344 uses the ECC to correct the memory data. In some cases, the number of bits that are in error exceeds a threshold amount that can be corrected. In such a case, the ECC error flag 240 is set and the correction circuitry 344 indicates that the failed memory location bits 318 are needed to correct the memory data. Once the failed memory location bits 318 are provided to the decoder 140 with the ECC data, the correction circuitry 344 has sufficient information to perform a correction using Reed-Solomon decoding with erasure decoding abilities or other decoding schemes, such as Bose-Chaudhuri-Hocquenghem (BCH) decoding. The corrected memory data is then output at 242. Alternatively, in some embodiments, the decoding logic 340 can output the faulty bit locations 242 and not perform a correction. Using the ECC and the failed memory locations 318, the correction of memory data is extended beyond what is possible with the ECC only. In this way, the decoder 140 can allow memory failures to be corrected dynamically during a memory read.

Figure 4:
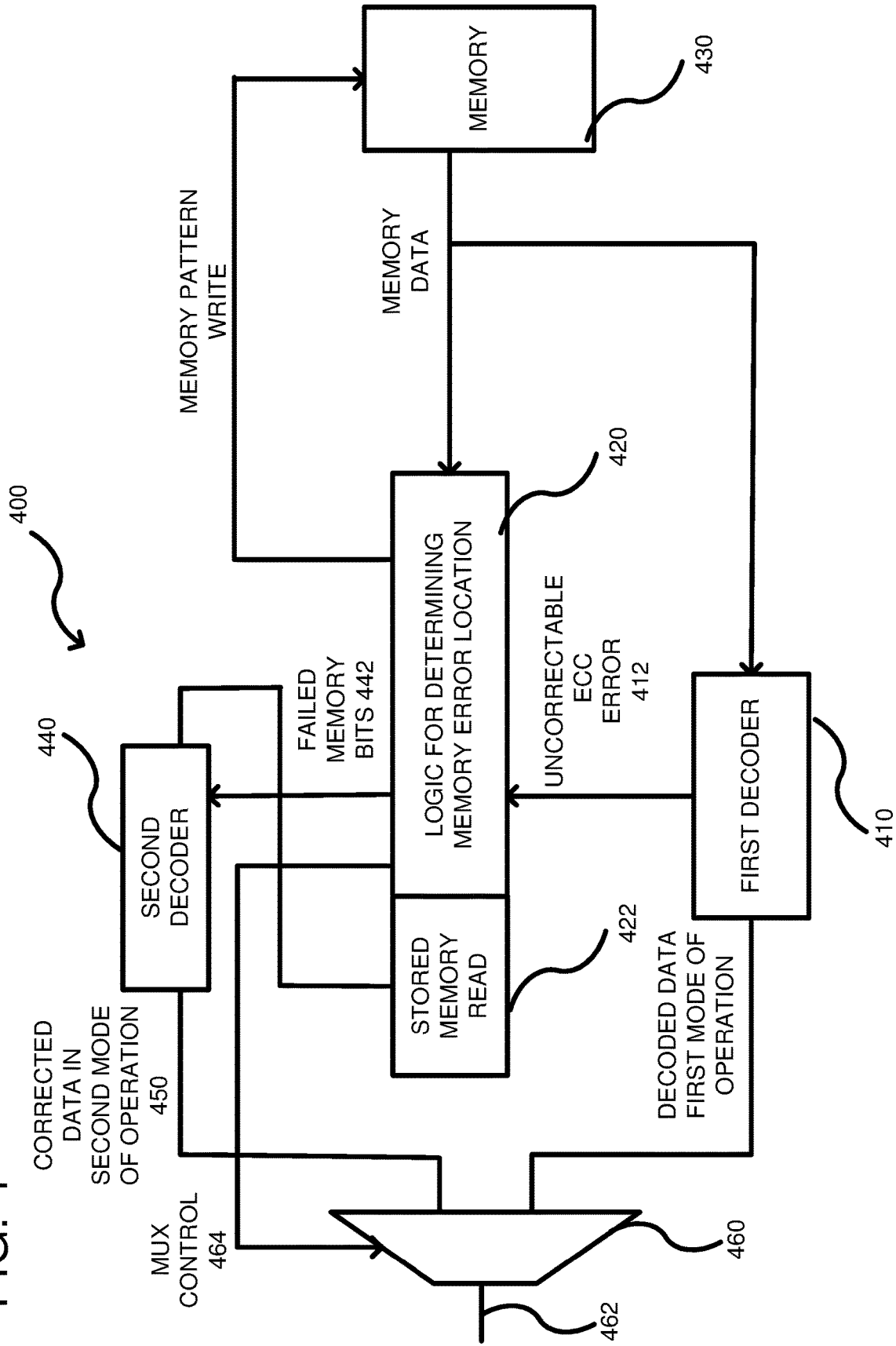
FIG. 4 is a circuit diagram according to another embodiment for correcting an ECC error using an integrated memory test.

FIG. 4 is another embodiment of a circuit 400 in which different decoders are used to perform the error correction of data. A first decoder 410 is used during a first mode of operation and can perform standard ECC corrections on data from memory 430 at an address of interest. However, if the number of bits of error exceeds a predetermined threshold (e.g., greater than 4 bits), then an uncorrectable ECC error flag 412 is set. In such a case, logic 420 initiates a second mode of operation wherein it performs one or more memory tests, as described above, to test the failing address in the memory 430. The logic 420 uses the test to determine which bits in the address line are failing. The logic 420 then supplies the stored data from a buffer 422 to a second decoder 440 that receives failed memory bit locations 442 and performs error correction on the memory data. The corrected memory data 450 is supplied to a multiplexer 460, which outputs the corrected data at output 462 due to the multiplexer control line 464. The logic 420 is similar to the logic described above for determining the failed memory bits. Using the circuit of FIG. 4, the first decoder 410 can be cheaper and faster, but not include the advanced Reed-Solomon encoding needed for extended error correction. Instead, the second decoder 440 can be used, which is slower, but includes more advanced error correction, such as by using the failed memory bit locations 442 in the error correction. The logic 420 controls the multiplexer 460 depending on whether the circuit 400 is in the first mode or second mode of operation. It should be understood that any of the modules in FIG. 4, such as the decoders 410, 440 or the logic 420 can be implemented in hardware, software or firmware. Additionally, if the circuit 400 does not perform correction, but, instead, outputs the faulty bit locations, then the second decoder 440 can be removed and the failed memory bit locations 442 can be output at 462.

Figure 5:
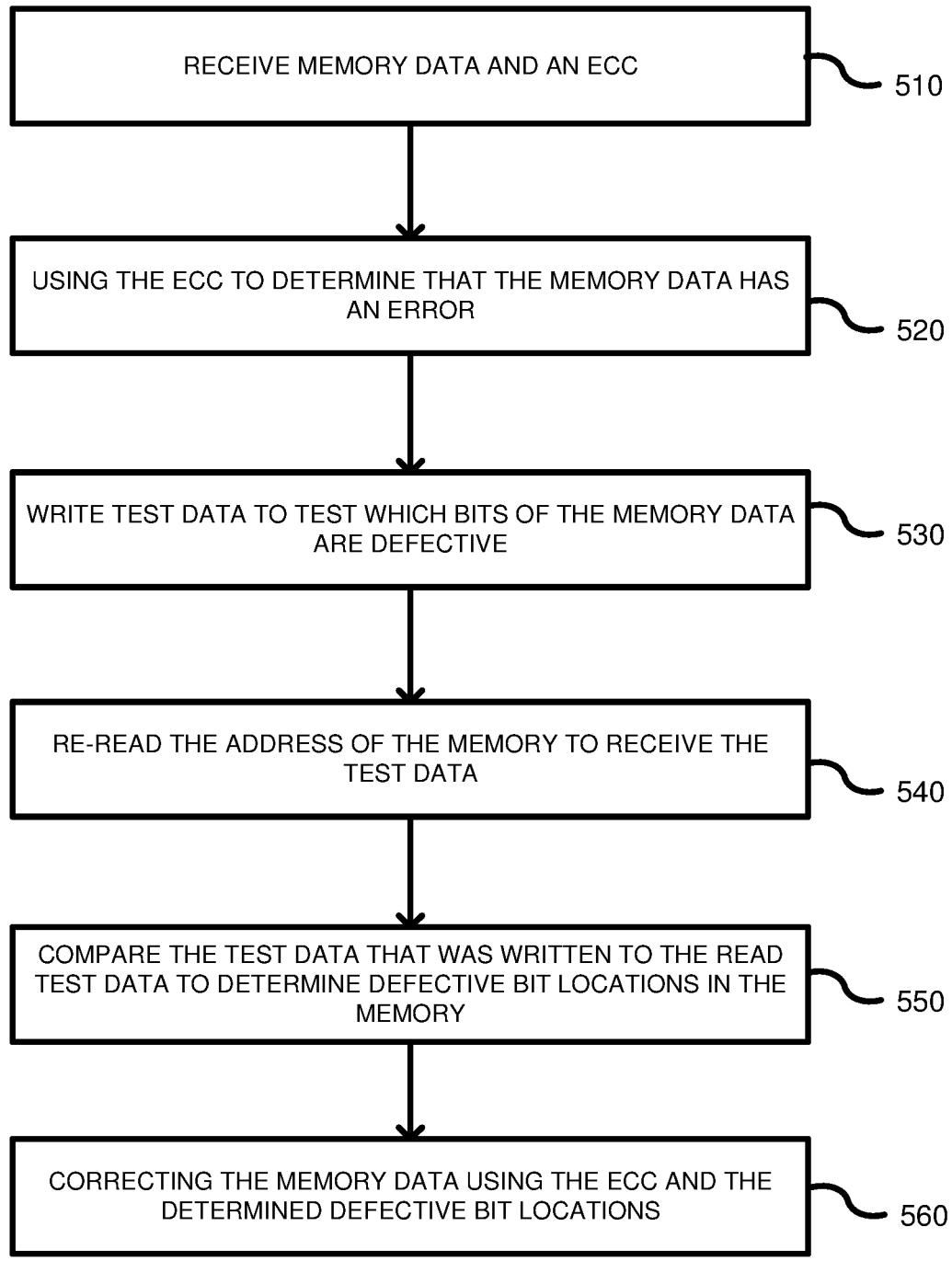
FIG. 5 is a flowchart according to one embodiment for correcting memory data.

FIG. 5 is a flowchart according to one embodiment. In process block 510, memory data and an ECC are received. For example, in FIG. 1, in a memory controller 130, data with the ECC 142 are received from the memory 120. In process block 520, the ECC is used to determine that the memory data has an error. For example, returning to FIG. 1, if the data 142 has an error, the decoder 140 can detect the error using the ECC. In process block 530, when the ECC error is detected, a write of test data is initiated to test which bits of the memory data are defective. For example, in FIG. 1, the logic 150 can detect which bits of memory (at the address from which the memory data was received) are defective by writing test data to the memory 120 at the address and reading the test data back (process block 540). Thus, the same address that was read in process block 510 is re-read in process block 540. The writing and re-reading can be to a single address or a block of addresses (e.g., 8 or 16 addresses). However, the test is not for the whole memory, but, rather, is limited to around the address where the error occurred. In process block 550, the test data that was written in process block 530 is compared to the data that is re-read in process block 540 using a bit-by-bit comparison. In this way, each bit that is incorrect (i.e., does not match) is considered a defective bit in the memory. Multiple different test patterns can be written and read to increase accuracy. In process block 560, the memory data can be corrected using the ECC and the determined defective bit locations. For example, in FIG. 2, the defective bit positions (i.e., failed memory location 218) and the ECC from the previous memory read (which initially failed) are used by the decoder 140 to correct the memory data.

Figure 6:
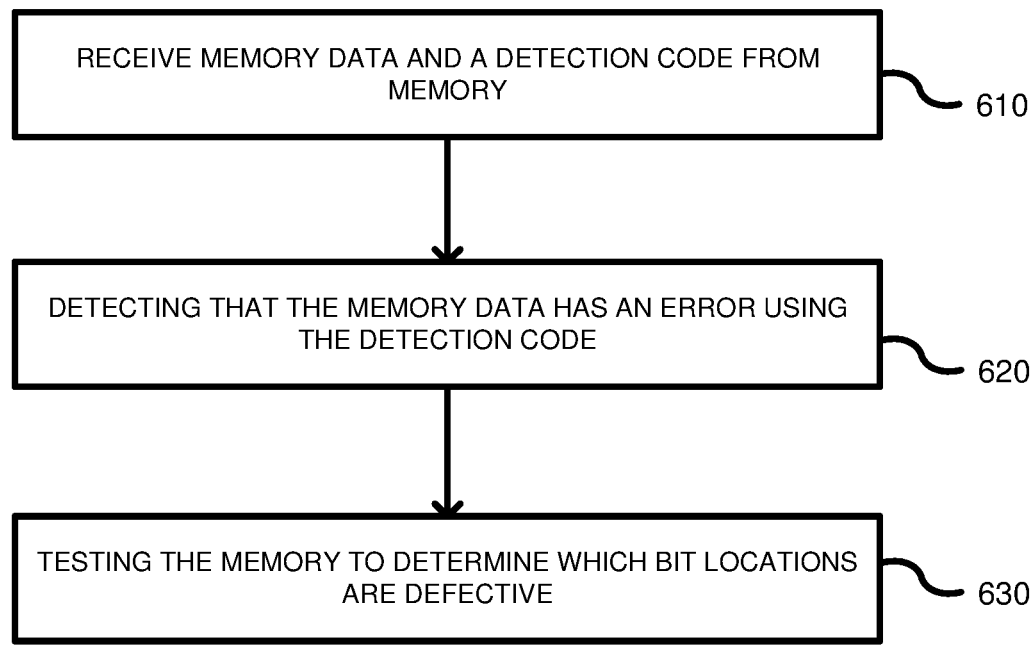
FIG. 6 is a flowchart according to another embodiment for correcting memory data.

FIG. 6 is a flowchart according to another embodiment. In process block 610, memory data is received. For example, in FIG. 3, memory data with a detection code, such as an ECC 150 or other detection code (e.g., cyclic redundancy check (CRC)), is received in the decoder 140, which can be decode module comprising hardware, software or firmware. In process block 620, an error is detected in the memory data using the detection code. For example, in FIG. 3, the error checking circuitry 342 detects an error in the data 150. However, the error is not correctable using the ECC because too many errors are in the data. Thus, an uncorrectable error flag 240 can be set. In process block 630, in response to the error flag, memory is tested to determine which bit locations are defective. For example, in FIG. 3, the logic 312 can write patterns to the memory 120 and the compare logic 314 can read and compare what was written to what was read to determine if a discrepancy exists. If so, the bits that have the discrepancy are the defective bit locations. The defective bit locations can then be passed onto other logic in the system that can either choose not to use the defective address or the defective bit locations. Alternatively, the defective bit locations and the correction code can be used to correct the memory data. For example, in FIG. 3, the correction circuitry 344 receives the failed memory location 318 and the memory data 319, which includes the original memory data that failed, and uses the received inputs to correct the memory data.

Figure 7:
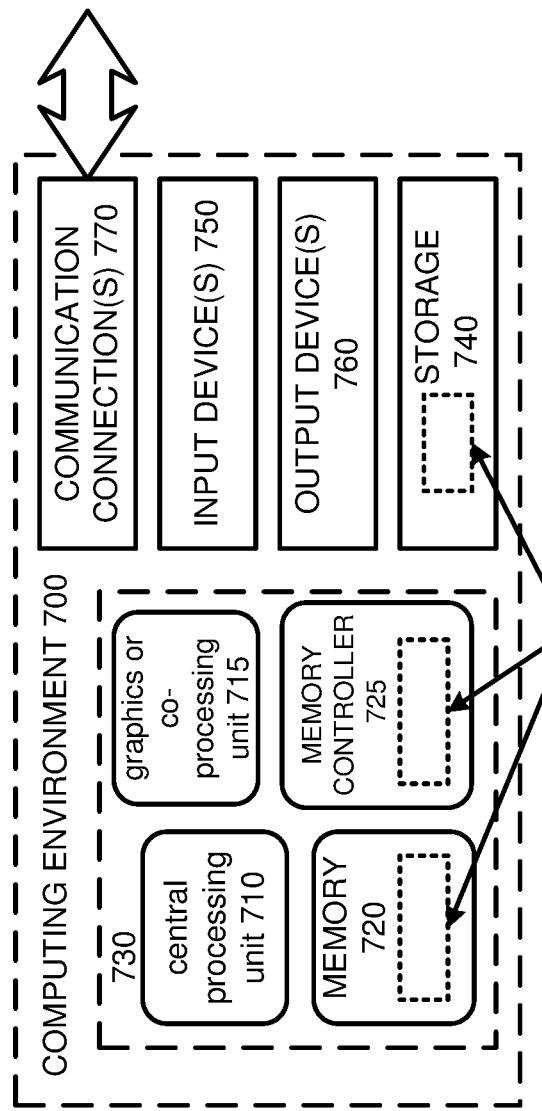
FIG. 7 depicts a generalized example of a suitable computing environment in which the described innovations may be implemented.

FIG. 7 depicts a generalized example of a suitable computing environment 700 in which the described innovations may be implemented. The computing environment 700 is not intended to suggest any limitation as to scope of use or functionality, as the innovations may be implemented in diverse general-purpose or special-purpose computing systems. For example, the computing environment 700 can be any of a variety of computing devices (e.g., desktop computer, laptop computer, server computer, tablet computer, etc.).

With reference to FIG. 7, the computing environment 700 includes one or more processing units 710, 715 and memory 720. A memory controller 725 can be the memory controller from the other embodiments described herein, such as the memory controller 130 of FIG. 1. In FIG. 7, this basic configuration 730 is included within a dashed line. The processing units 710, 715 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 7 shows a central processing unit 710 as well as a graphics processing unit or co-processing unit 715. The tangible memory 720 may be volatile memory (e.g., registers, cache, RAM), non-volatile memory (e.g., ROM, EEPROM, flash memory, etc.), or some combination of the two, accessible by the processing unit(s). The memory 720 stores software 780 implementing one or more innovations described herein, in the form of computer-executable instructions suitable for execution by the processing unit(s). As shown, the memory controller 725 can also include software for implementing features described herein.

A computing system may have additional features. For example, the computing environment 700 includes storage 740, one or more input devices 750, one or more output devices 760, and one or more communication connections 770. An interconnection mechanism (not shown) such as a bus, controller, or network interconnects the components of the computing environment 700. Typically, operating system software (not shown) provides an operating environment for other software executing in the computing environment 700, and coordinates activities of the components of the computing environment 700.

The tangible storage 740 may be removable or non-removable, and includes magnetic disks, magnetic tapes or cassettes, CD-ROMs, DVDs, or any other medium which can be used to store information in a non-transitory way and which can be accessed within the computing environment 700. The storage 740 stores instructions for the software 780 implementing one or more innovations described herein.

The input device(s) 750 may be a touch input device such as a keyboard, mouse, pen, or trackball, a voice input device, a scanning device, or another device that provides input to the computing environment 700. The output device(s) 760 may be a display, printer, speaker, CD-writer, or another device that provides output from the computing environment 700.

The communication connection(s) 770 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, aspects of the disclosed technology can be implemented by software written in C++, Java, Perl, any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only examples of the invention and should not be taken as limiting the scope of the invention. We therefore claim as our invention all that comes within the scope of these claims.

What is claimed is:

1. A method of correcting memory data, the method comprising:
   receiving, in decode circuitry, memory data from an address of memory and an Error Correction Code (ECC) included with the memory data;
   in the decode circuitry, using the ECC to determine whether the memory data has an error;
   determining that the error is not correctable using the ECC and, in response, writing test data to the address to test which bits of the memory data are defective;
   re-reading the address of the memory to receive the read test data;
   comparing the test data written to the read test data to determine defective bit locations in the memory at the address for any bits of the test data written that do not match the read test data;
   switching a multiplexer coupled between the memory and the decode circuitry and re-transmitting the memory data through the multiplexer into the decode circuitry together with the defective bit locations; and
   correcting the memory data using the ECC and the determined defective bit locations.

2. The method of claim 1, further including storing the memory data until the defective bit locations are determined and then injecting the memory data into the decode circuitry together with the defective bit locations.

3. The method of claim 1, wherein the decode circuitry is a first decoder and wherein the correcting of the memory data occurs in a second decoder separate from the first decoder.

4. The method of claim 1, wherein the memory is a Dynamic Random Access Memory (DRAM).

5. The method of claim 1, wherein the writing of the test data is a first write, and further including writing multiple different patterns of test data to the address in order to determine the defective bit locations.

6. A method, comprising:
   receiving memory data including a detection code from a memory location at a memory address of a memory;
   detecting, in a decoder, that the memory data has an error using the detection code;

determining that the error is not correctable using the detection code, and in response, testing the memory at the memory address to determine which bit locations are defective;

switching a multiplexer positioned between the decoder and the memory and re-transmitting the memory data through the multiplexer to the decoder and transmitting the defective bit locations to the decoder; and using both the detection code and the defective bit locations to correct the memory data.

7. The method of claim 6, wherein the detection code includes an error correction code (ECC) and the correction of the memory data is performed using Reed-Solomon coding or Bose-Chaudhuri-Hocquenghem (BCH) decoding.

8. The method of claim 6, further including storing the memory data in a storage location while testing the memory location and, after the defective bit locations are determined, transmitting the memory data from the storage location into the decoder together with the defective bit locations.

9. The method of claim 6, wherein the testing of the memory includes writing a pattern to the memory location, reading the memory location after the pattern is written, and performing a bit-level comparison of the pattern that was written to data read at the memory location.

10. The method of claim 9, wherein the writing of the pattern is a first write, and further including writing multiple different patterns to the memory address in order to determine the defective bit locations.

11. The method of claim 6, wherein the using of the detection code and the defective bit locations to correct the memory is accomplished using a decode module.

12. The method of claim 11, wherein the decode module includes a first decoder and wherein the correcting of the memory data occurs in a second decoder separate from the first decoder.

13. An integrated circuit (IC), comprising:
a decoder configured to receive input memory data from a memory, the decoder including an error checking engine configured to perform an Error Correction Code (ECC) check, wherein the decoder is further configured to determine that the error is not correctable using the ECC;

logic coupled to the decoder configured to test the memory in response to an error indication from the error checking engine, which indicates that the error is not correctable, and configured to transmit to the decoder bit information indicating which bits of the input memory data are erroneous, wherein the decoder includes correction circuitry configured to use an ECC code included in the memory data and the bit information to correct the memory data; and a multiplexer having an output coupled to the decoder and a first input coupled to the memory and a second input coupled to the logic, wherein the logic is configured to switch the multiplexer to re-transmit the input memory data to the decoder with the bit information.

14. The IC of claim 13, wherein the logic coupled to the decoder is configured to test the memory by writing a pattern and determining which bits of the pattern are incorrect upon reading the pattern from the memory.

15. The IC of claim 13, wherein the logic is configured to store the memory data and to transmit the memory data to the decoder together with the bit information.

16. The IC of claim 13, further including compare logic configured to read a pattern from the memory and to compare the pattern to a known pattern to determine the bit information.

17. The IC of claim 13, wherein the logic only tests the memory when the decoder cannot correct an error without the bit information or as part of a scan process of the memory.

* * * * *